United States Patent
Tajima (10) Patent No.: US 8,726,046 B2
(45) Date of Patent: May 13, 2014

(54) INTEGRATED CIRCUIT DEVICE AND CONTROL METHOD FOR ELECTROSTATIC PROTECTION CIRCUIT THEREOF

(75) Inventor: Akimitsu Tajima, Yokohama (JP)

(73) Assignee: Fujitsu Semiconductor Limited, Yokohama (JP)

( * ) Notice: Subject to any disclaimer, the term of this patent is extended or adjusted under 35 U.S.C. 154(b) by 505 days.

(21) Appl. No.: 13/031,002

(22) Filed: Feb. 18, 2011

(65) Prior Publication Data

US 2011/0314308 A1 Dec. 22, 2011

(30) Foreign Application Priority Data

Jun. 18, 2010 (JP) .................................. 2010-139296

(51) Int. Cl.
*G06F 1/26* (2006.01)
*G06F 1/30* (2006.01)

(52) U.S. Cl.
USPC .............. 713/300; 713/310; 713/330; 361/56

(58) Field of Classification Search
USPC ............................... 713/300, 310, 330; 361/56
See application file for complete search history.

(56) References Cited

U.S. PATENT DOCUMENTS

| 7,164,565 | B2 * | 1/2007 | Takeda ........................... 361/56 |
| 2006/0285183 | A1 | 12/2006 | Sato et al. |
| 2007/0082626 | A1 | 4/2007 | Nomizo et al. |
| 2007/0109698 | A1 | 5/2007 | Kim |
| 2008/0079409 | A1 * | 4/2008 | Motomori et al. ............ 323/283 |

FOREIGN PATENT DOCUMENTS

| JP | 2006-351108 A | 12/2006 |
| JP | 2007-59444 A | 3/2007 |
| JP | 2007-142423 A | 6/2007 |
| JP | 2007-202194 A | 8/2007 |

* cited by examiner

*Primary Examiner* — Paul Yanchus, III
*Assistant Examiner* — Michael J Brown
(74) *Attorney, Agent, or Firm* — Arent Fox LLP (57) ABSTRACT

The integrated circuit device includes: an electrostatic protection circuit that is provided between first and second power supply lines coupled to external terminals respectively, and forms a current pathway between the first and second power supply lines during a given period in response to an increase in a voltage between the first and second power supply lines; and a power supply generating circuit that performs power supply control based on a voltage of the first power supply line and generates a control signal in accordance with a switching timing of the power supply control. And, the electrostatic protection circuit includes an adjustment circuit for shortening the given period in response to the control signal.

12 Claims, 11 Drawing Sheets

INTEGRATED CIRCUIT DEVICE AND CONTROL METHOD FOR ELECTROSTATIC PROTECTION CIRCUIT THEREOF

CROSS-REFERENCE TO RELATED APPLICATION

This application is based upon and claims the benefit of priority of the prior Japanese Patent Application No. 2010-139296, filed on Jun. 18, 2010, the entire contents of which are incorporated herein by reference.

FIELD

The embodiment discussed herein relates to an integrated circuit device and a control method for an electrostatic protection circuit thereof.

BACKGROUND

In an integrated circuit device, a semiconductor chip formed with an integrated circuit is accommodated in a package. To reduce power consumption in an integrated circuit device packaged in a battery-driven electronic machine such as a portable telephone or a portable information terminal, a power supply generating circuit that generates an internal power supply voltage by reducing an external power supply voltage is built into the device. A DCDC converter or the like, for example, is available as this power supply generating circuit.

Meanwhile, to protect an integrated circuit device from static electricity, an electrostatic protection circuit is provided at an input/output terminal coupled to an external terminal of the package. Under normal usage conditions, the electrostatic protection circuit does not operate, but when a voltage between the input/output terminal and a ground terminal increases rapidly due to application of a static electricity charge or the like, the electrostatic protection circuit operates to absorb the applied charge.

This type of electrostatic protection circuit is described in Japanese Laid-open Patent Applications No. 2007-142423, No. 2007-59444, and No. 2007-202194, for example.

During a normal operation, a power supply generating circuit such as a DCDC converter generates a power supply voltage by supplying a current from an external power supply by means of pulse driving in accordance with a consumed current of a load circuit to which the generated power supply voltage is to be supplied. Noise may be generated in a wire of the external power supply due to the pulse driving, and this noise may cause the electrostatic protection circuit to malfunction.

Further, in an integrated circuit to which a power supply voltage generated by a power supply generating circuit is supplied, the generated power supply voltage may rise rapidly when the power supply generating circuit is activated, causing an electrostatic protection circuit provided at a power supply voltage supply terminal to operate in order to suppress the rise of the power supply voltage, and as a result, the rise of the power supply voltage may be impeded.

SUMMARY

A first aspect of the integrated circuit device includes: an electrostatic protection circuit that is provided between first and second power supply lines coupled to external terminals respectively, and forms a current pathway between the first and second power supply lines during a given time constant period in response to an increase in a voltage between the first and second power supply lines; and a power supply generating circuit that performs power supply control based on a voltage of the first power supply line and generates a control signal in accordance with a switching timing of the power supply control. And, the electrostatic protection circuit includes an adjustment circuit for shortening the given time constant period in response to the control signal.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

First Embodiment

Figure 1:
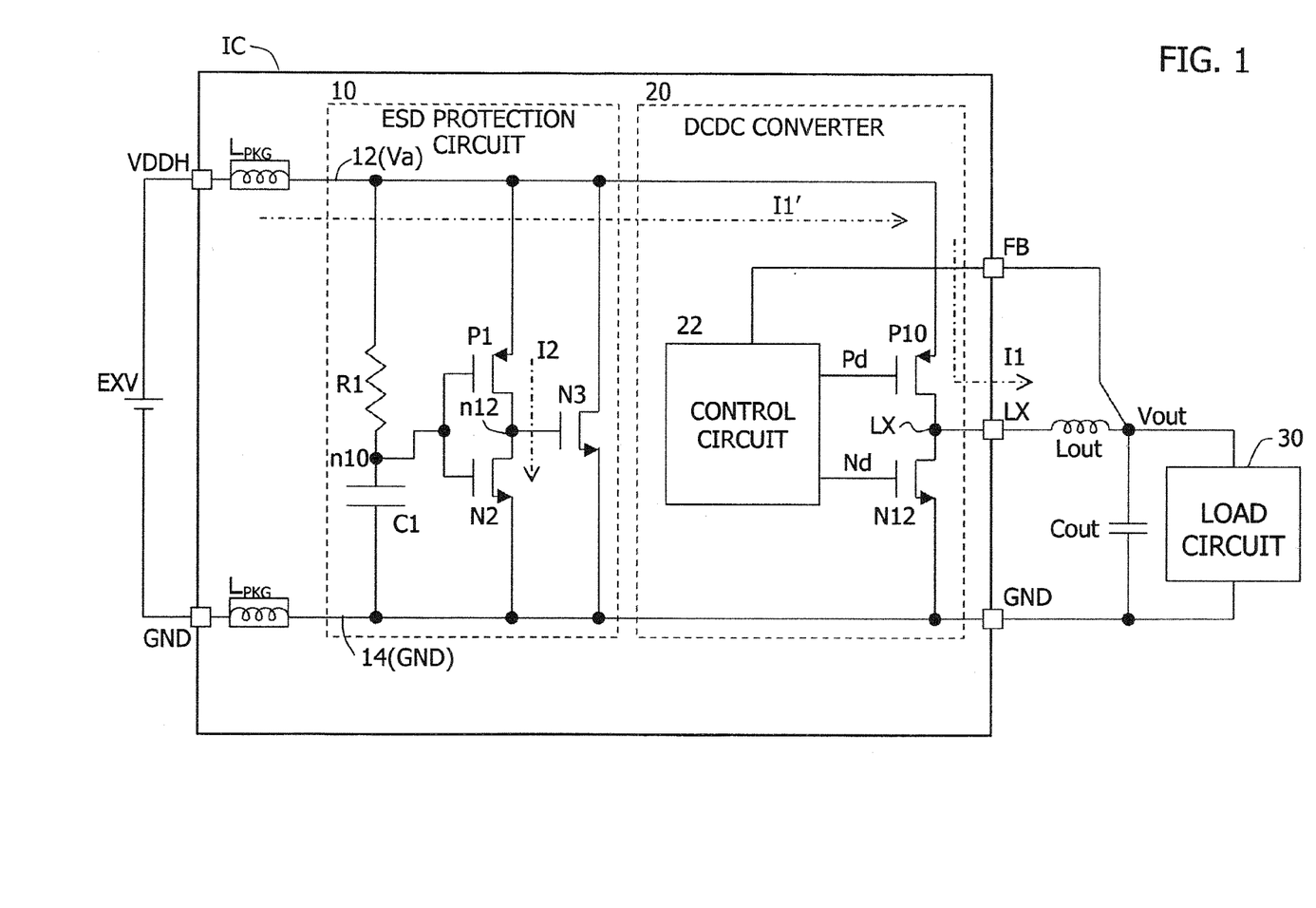
FIG. 1 is a constitutional diagram of an integrated circuit device according to this embodiment.

FIG. 1 is a constitutional diagram of an integrated circuit device according to this embodiment. In an integrated circuit device IC, an integrated circuit chip having an electrostatic protection circuit 10 and a power supply generating circuit 20 is accommodated in a package having an external terminal. For example, a power supply terminal VDDH to which a voltage of an external power supply EXV is supplied and an external terminal of aground power supply GND are respectively coupled to a first power supply line 12 and a second power supply line 14 in the integrated circuit chip via a bonding wire $L_{PKG}$. Bonding wires of external terminals FB, LX, GND on the right side of the drawing are not shown.

In response to a rapid increase in a voltage between the first and second power supply lines 12, 14, the electrostatic protection circuit 10 forms a current pathway between the two power supply lines 12, 14 using a transistor N3 during a period of a given time constant. More specifically, the electrostatic protection circuit 10 includes a filter circuit constituted by a resistor R1 and a capacitor C1, a CMOS inverter constituted by a P-channel transistor P1 and an N-channel transistor N2, into which a node n10 of the filter circuit is input, and an N-channel transistor N3, which is coupled between the two power supply lines 12, 14 and has a gate into which an output n12 of the CMOS inverter is input.

Meanwhile, the power supply generating circuit 20 is a DCDC converter, for example, that generates an output power supply voltage Vout from a power supply voltage Va of the first power supply line 12. The power supply generating circuit 20 includes a P-channel transistor P10 provided between the first power supply line 12 and the output terminal LX, an N-channel transistor N12 provided between the second power supply line 14 and the output terminal LX, and a control circuit 22 that switches the transistors P10, N12 alternately. The output terminal LX is coupled to an output inductor Lout provided on an outer side of the integrated circuit device IC, and the output inductor Lout is coupled to an output capacitor Cout. An output voltage Vout controlled to a desired voltage is generated in a connection node between the output inductor Lout and the output capacitor Cout. The output voltage Vout is supplied to a load circuit 30 as a power supply voltage thereof.

The electrostatic protection circuit 10 prevents an internal circuit from breaking, when static electricity is applied to the external terminals VDDH, GND and the voltage between the internal first and second power supply lines 12, 14 increases rapidly. This operation is performed as follows. Under normal usage conditions, the capacitor C1 of the filter circuit is charged by the voltage of the first power supply line 12 such that the node n10 reaches an H level. As a result, the transistors N2 and P1 of the CMOS inverter turn ON and OFF, respectively, such that the node n12 reaches an L level and the transistor N3 enters a non-conductive state. Accordingly, a current pathway is not formed between the first and second power supply lines 12, 14, and the internal circuit operates normally.

When positive static electricity is applied to the external terminal VDDH, the voltage between the first and second power supply lines 12, 14 increases rapidly, the connection node n10 between the resistor R1 and the capacitor C1 forming the filter circuit increases gently in accordance with a CR time constant of the filter circuit. Accordingly, a gate-source voltage of the P-channel transistor P1 exceeds a threshold voltage such that the transistor P1 becomes conductive, and as a result, the node n12 increases such that the transistor N3 is conductive. Thus, a current pathway of the transistor N3 is formed between the first and second power supply lines 12, 14, and therefore a static electricity charge applied to the first power supply line 12 flows to the second power supply line 14 side to prevent the internal circuit from breaking. When a period of the CR time constant of the filter circuit has elapsed, the capacitor C1 is charged such that the node n10 increases, whereby the transistor P1 becomes non-conductive, and as a result, the node n12 decreases such that the transistor N3 becomes non-conductive. Normal usage conditions are thus re-established.

When negative static electricity is applied to the external terminal GND, the voltage between the first and second power supply lines 12, 14 increases rapidly, causing the filter circuit, the CMOS inverter, and the transistor N3 to operate similarly such that the transistor N3 becomes conductive, thereby forming a current pathway, for the period of the CR time constant of the filter circuit.

Note that when negative static electricity is applied to the external terminal VDDH and when positive static electricity is applied to the external terminal GND, a diode between a substrate of the transistor N3 and a source or a drain is energized such that a current pathway is formed from the second power supply line 14 toward the first power supply line 12.

This type of electrostatic protection circuit 10 is also provided between an input/output terminal coupled to another external terminal and the second power supply line 14.

Next, an operation of the power supply generating circuit 20 and a malfunction of the electrostatic protection circuit 10 caused thereby will be described. In the power supply generating circuit 20, the control circuit 22 monitors the output voltage Vout via a feedback terminal FB, and generates drive pulses Pd, Nd using given pulse modulation control based on a potential of the output voltage Vout. In other words, the control circuit 22 generates the drive pulses Pd, Nd such that the output voltage Vout becomes a desired voltage level. The pulse modulation control takes the form of pulse width modulation (PWM) or pulse frequency modulation (PFM), for example. With pulse width modulation, the output voltage Vout may be increased by widening a pulse width of an L level of the drive pulse Pd and reduced by narrowing the pulse width. With pulse frequency modulation, the output voltage Vout may be increased by increasing a pulse frequency of the L level of the drive pulse Pd and reduced by reducing the pulse frequency.

The drive pulses Pd, Nd are in-phase pulses, for example, such that when the drive pulses Pd, Nd reach the L level, the transistor P10 becomes conductive and the transistor N12 becomes non-conductive, whereby a current I1 in the drawing flows from the first power supply line 12 toward the output terminal LX. This drive current I1 causes the output inductor Lout to store energy and the output voltage Vout to increase. Conversely, when the drive pulses Pd, Nd reach the H level, the transistor P10 becomes non-conductive and the transistor N12 becomes conductive, whereby the current flowing from the first power supply line 12 toward the output terminal LX is blocked. However, due to an induced electromotive force of the output inductor Lout, a current flowing from the output terminal LX to the output voltage Vout side continues to flow through the transistor N12. When the energy in the output inductor Lout eventually dissipates, the current flowing from the output terminal LX to the output voltage Vout side disappears, and if the transistor N12 is maintained in a conductive state, a reverse current flows to the output inductor Lout.

When the transistor P10 is switched from the conductive state to the non-conductive state during power supply control in which the power supply generating circuit 20 performs the switching operation described above, the current I1' continues to flow through the first power supply line 12 due to an induced electromotive force of the bonding wire $L_{PKG}$ between the package and the integrated circuit chip. However, since the transistor P10 is in the non-conductive state, the pathway for the current I1' disappears, and therefore the voltage Va of the first power supply line 12 increases rapidly. Inductance in the bonding wire $L_{PKG}$ increases as the bonding wire becomes longer or narrower, leading to an increase in the continuously flowing current I1', and as a result, a noise component generated in the voltage Va of the first power supply line 12 becomes more difficult to ignore.

When the noise component of the voltage Va in the first power supply line 12 is at a level that may not be ignored, the node n10 of the filter circuit may not follow the increase in the voltage Va under similar principles to those applied during static electricity application. Therefore, the transistor P1 enters the conductive state, and as a result, a minute through current I2 flows through the transistors P1, N2. The noise component does not cause as large a voltage increase as static electricity, and therefore the transistor N3 may not be energized. However, the minute through current I2 flows through the CMOS inverter including the transistors P1, N2, leading to an increase in current consumption. The through current I2, although minute, is generated every time the transistor P10 of the power supply generating circuit 20 is switched OFF, and therefore the increase in current consumption may not be ignored.

Figure 2:
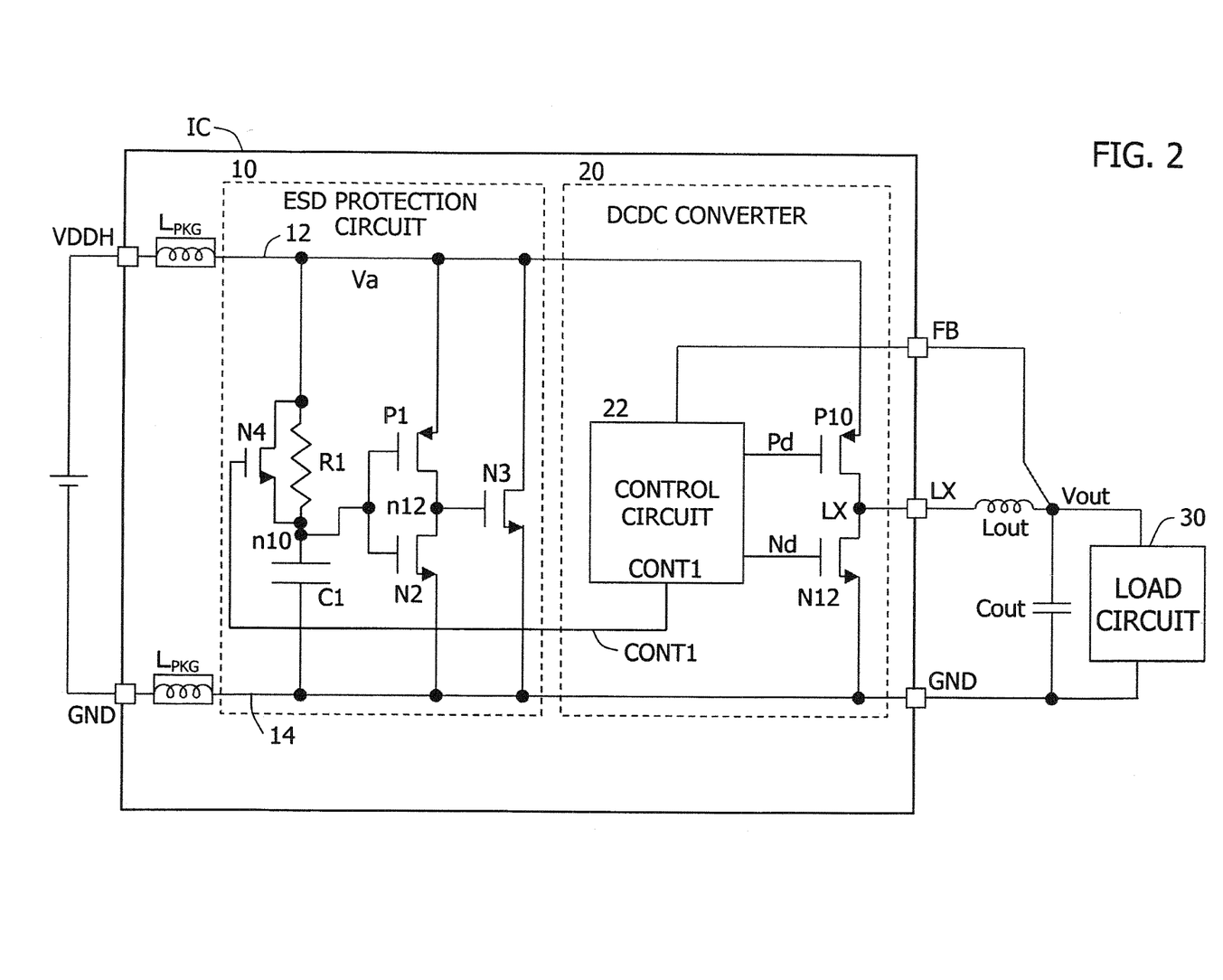
FIG. 2 is a constitutional diagram indicating the integrated circuit device according to this embodiment.
Figure 3:
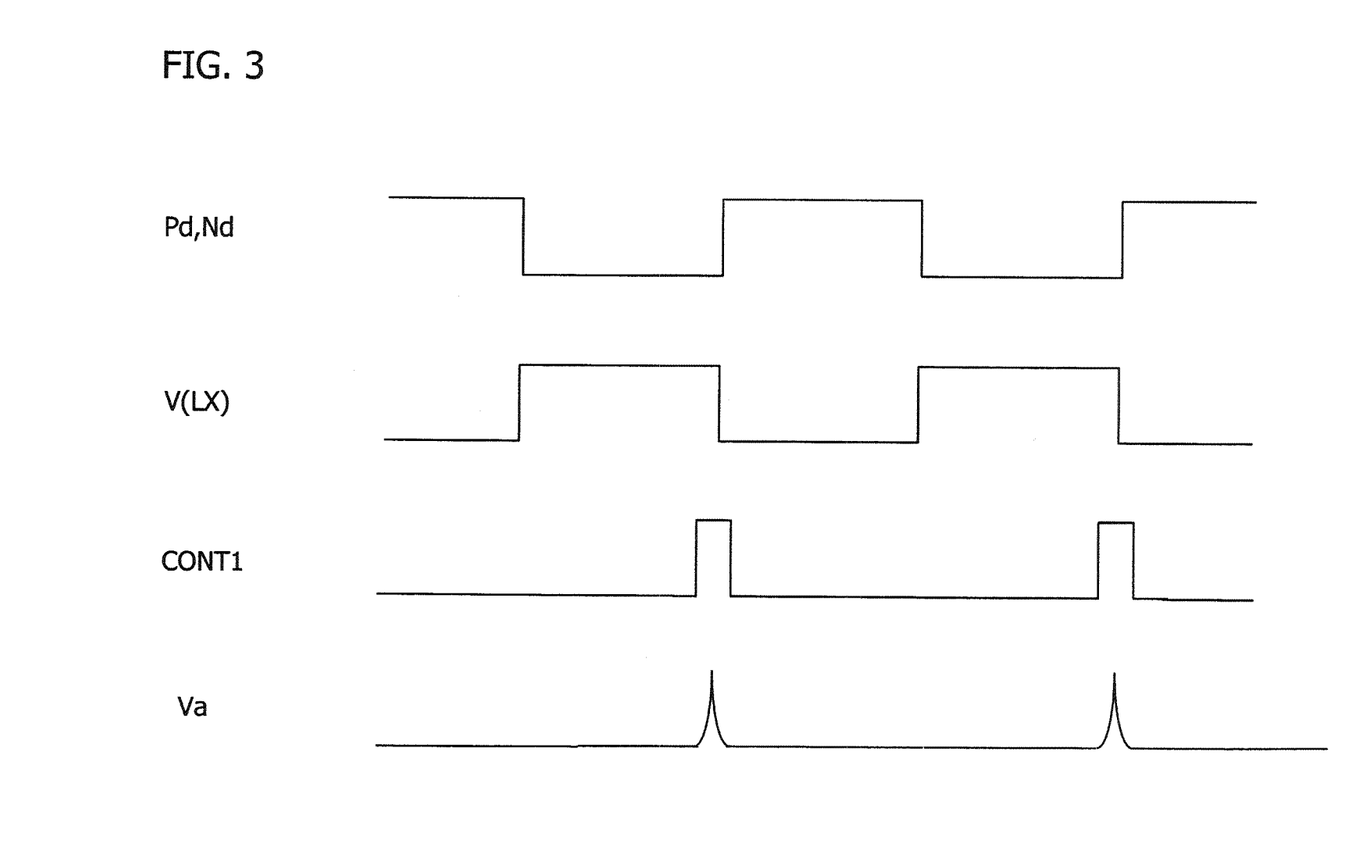
FIG. 3 is an operation waveform diagram of FIG. 2.

FIG. 2 is a constitutional diagram indicating the integrated circuit device according to this embodiment. FIG. 3 is an operation waveform diagram thereof. This constitution differs from that of the integrated circuit device shown in FIG. 1 in that the control circuit 22 generates a control signal CONT1 having a pulse aligned with a timing at which the drive pulse signals Pd, Nd are switched from the L level to the H level, an N-channel transistor N4 is provided to short-circuit both ends of the resistor R1 in the filter circuit of the electrostatic protection circuit 10, and the control signal CONT1 is applied to a gate of the transistor N4. All other constitutions are identical to FIG. 1. The transistor N4 is an adjustment circuit for temporarily shortening the period of an RC time constant of the filter circuit.

As shown in FIG. 3, when the drive pulse signals Pd, Nd are switched from the L level to the H level, the P-channel transistor P10 of the power supply generating circuit 20 switches from the conductive state to the non-conductive state. The control signal CONT1 has a pulse that is aligned with this timing. In the case of FIG. 1, the voltage Va of the first power supply line 12 includes a minute noise component due to the current flowing through the bonding wire $L_{PKG}$, and because of the RC time constant of the filter circuit, the node n10 may not follow this noise. As a result, a through current I2 is generated in the CMOS inverter.

With the constitution shown in FIG. 2, however, the transistor N4 in the electrostatic protection circuit 10 is energized by the pulse of the control signal CONT1 at the ON to OFF switching timing of the transistor P10 in the power supply generating circuit 20, and therefore the RC time constant of the filter circuit is temporarily shortened. Hence, the node n10 increases quickly in response to an increase in the voltage Va of the first power supply line 12, and therefore the transistor P1 remains non-conductive such that the through current I2 is prevented from occurring. As a result, the current flowing through the first power supply line 12 does not flow to a ground of the second power supply line 14, and a current from a battery is not consumed wastefully.

Figure 4:
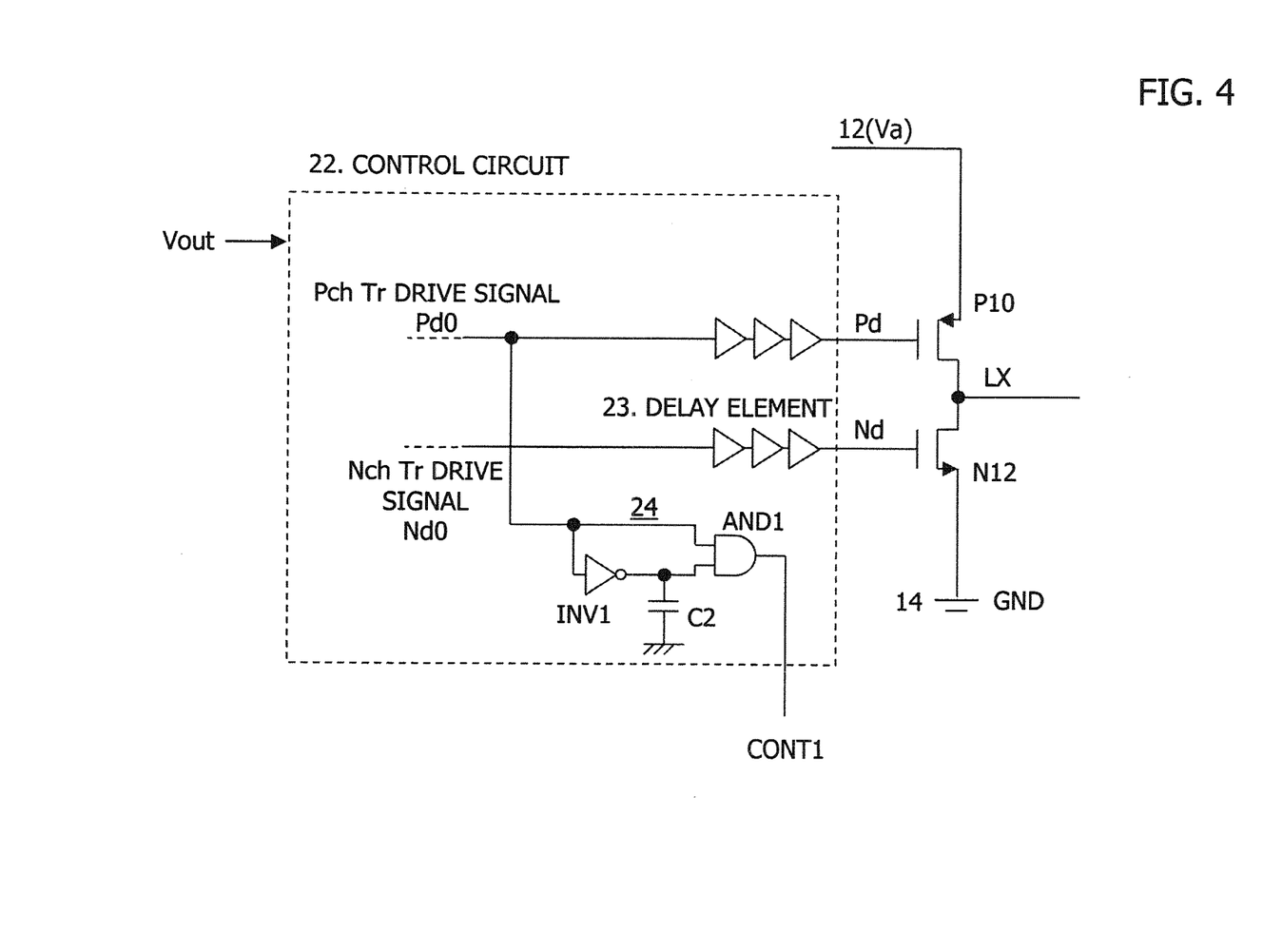
FIG. 4 is a diagram of a circuit for generating the control signal CONT1 in the control circuit 22 of the power supply generating circuit.
Figure 5:
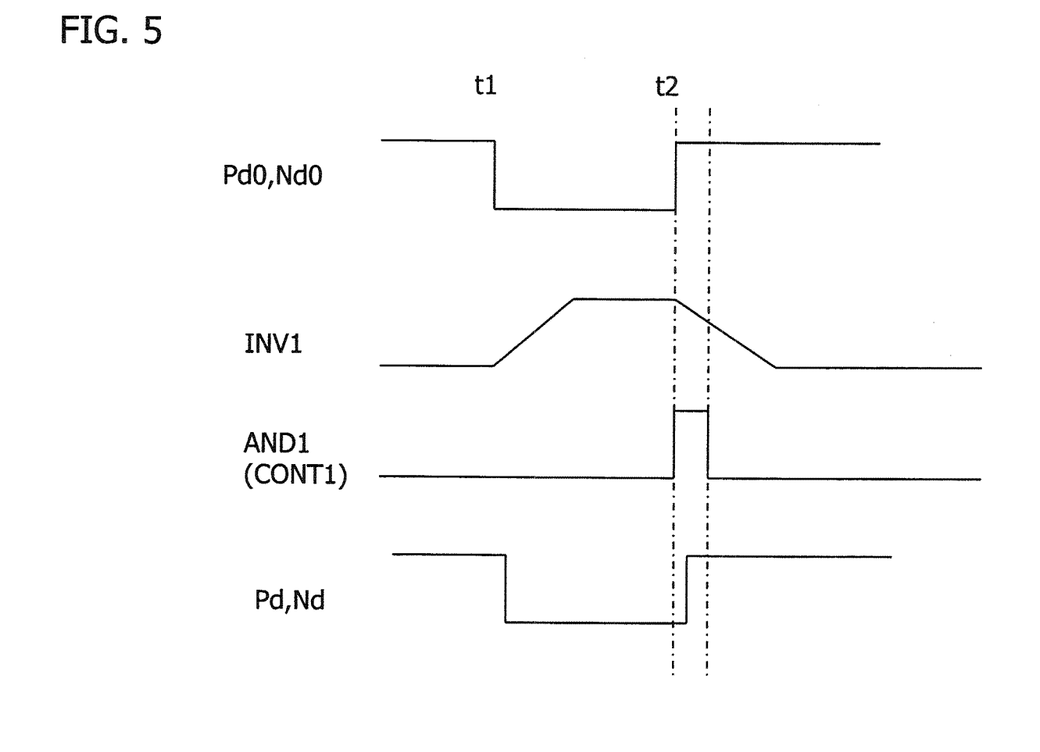
FIG. 5 is a waveform diagram indicating an operation thereof.

FIG. 4 is a diagram of a circuit for generating the control signal CONT1 in the control circuit 22 of the power supply generating circuit. FIG. 5 is a waveform diagram indicating an operation thereof. As described above, the control circuit 22 generates the drive pulse signals Pd, Nd for driving the transistors P10, N12 that are switched in order to drive the power supply. In FIG. 4, the drive pulse signals Pd, Nd in the control circuit 22 are output from pulse signals Pd0, Nd0 via a delay element 23.

Meanwhile, a circuit 24 for generating the control signal CONT1 includes an inverter INV1, a capacitor C2, and an AND gate AND1. The control signal generating circuit 24 generates the control signal CONT1 at a rising edge timing of the pulse signal Pd0. As shown in FIG. 5, the AND gate AND1 generates the control signal CONT1 having a short pulse, at a time t2 serving as the rising edge timing of the pulse signal Pd0, according to the H level of the pulse signal Pd0 and an H level of an output of the inverter INV1, which is reduced slowly by the capacitor C2. The timing of the short pulse of the control signal CONT1 is aligned with a rising edge of the drive pulse signal Pd being output via the delay element 23 by the control circuit 22.

Hence, in this embodiment, the control signal CONT1 having a pulse that is aligned with the rising edge of the drive pulse signal Pd temporarily energizes the transistor N4 provided in the filter circuit of the electrostatic protection circuit, thereby suppressing generation of a through current I2 due to noise in the voltage Va of the first power supply line 12.

Second Embodiment

Figure 6:
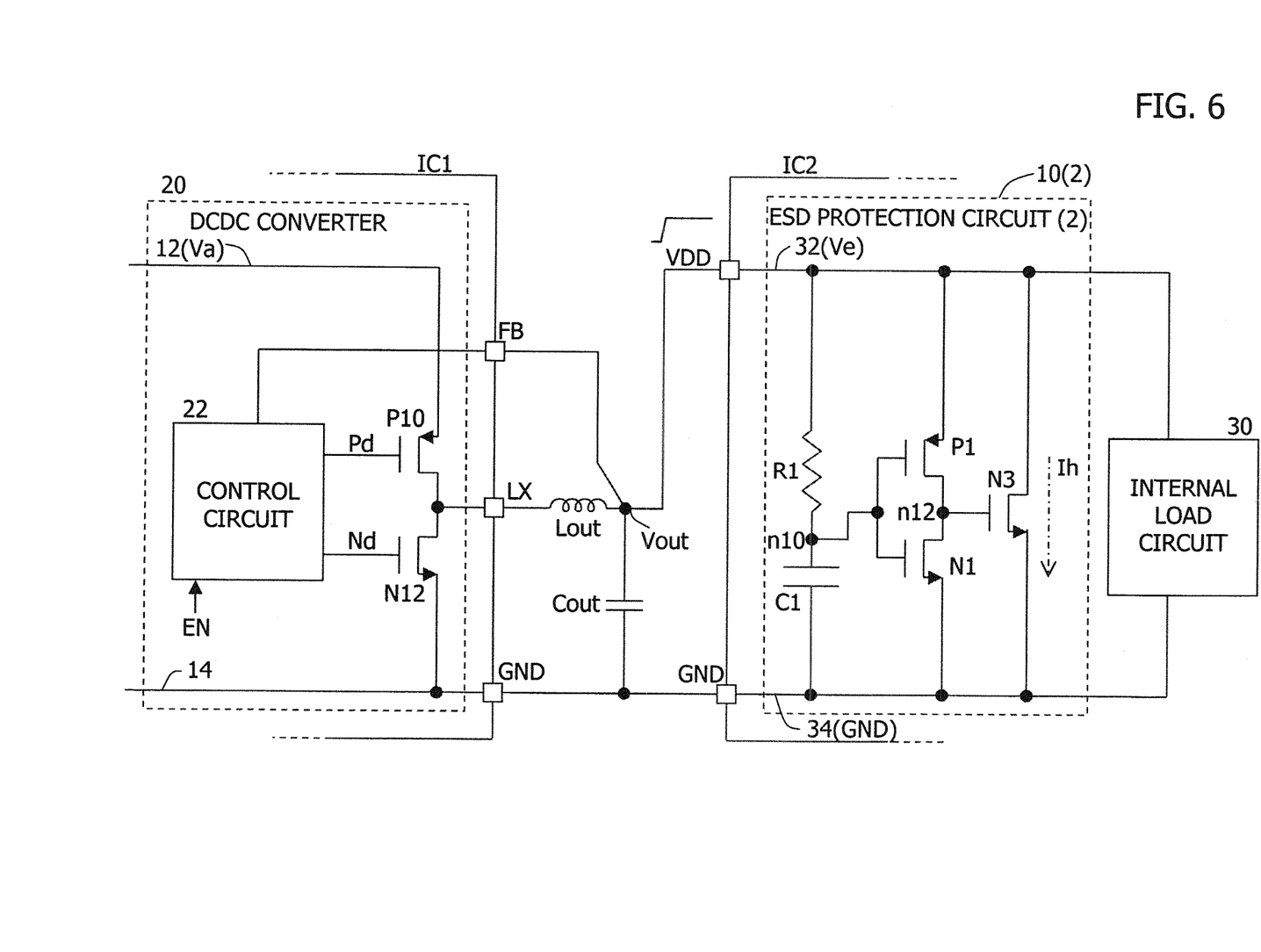
FIG. 6 is a constitutional diagram of an integrated circuit according to a second embodiment.

FIG. 6 is a constitutional diagram of an integrated circuit according to a second embodiment. The power supply generating circuit 20 is provided in a first integrated circuit device IC1. The connection node LX of the transistors P10, N12 subjected to switching control by the drive pulses Pd, Nd from the control circuit 22 of the power supply generating circuit is coupled to the external output inductor Lout and output capacitor Cout. The output voltage Vout generated in the connection node of the output inductor Lout and the output capacitor Cout is supplied to an external power supply terminal VDD of a second integrated circuit device IC2.

In the second integrated circuit device IC2, the external power supply terminal VDD and an external ground terminal GND are respectively coupled to internal first and second power supply lines 32, 34. An electrostatic protection circuit 10(2) is provided between the first power supply line 32 and the second power supply line 34. Similarly to FIG. 1, the electrostatic protection circuit 10(2) includes a filter circuit constituted by a resistor R1 and a capacitor C1, a CMOS inverter constituted by a P-channel transistor P1 and an N-channel transistor N2, and a charge absorbing transistor N3 that forms a current path for absorbing a charge.

Further, an internal load circuit 30 is provided in the second integrated circuit IC2, and the output voltage Vout generated by the power supply generating circuit 20 in the first integrated circuit IC1 is supplied to the internal load circuit 30 as an internal power supply VDD.

The power supply generating circuit 20 generates the stable output voltage Vout by performing a switching operation on the transistors P10, N12 such that a current is supplied from the supply power supply line 12 (Va) to the output inductor Lout and output capacitor Cout via the output node LX. The output voltage Vout is supplied to the first power supply line 32 (Ve) of the second integrated circuit device IC2 and to the control circuit 22 of the power supply generating circuit 20 via the feedback terminal FB of the first integrated circuit device IC1. As described above, the control circuit 22 generates the drive pulse signals Pd, Nd through pulse width modulation or pulse frequency modulation such that the fed-back output voltage Vout is maintained at a desired voltage, and drives the transistors P10, N12 using the generated drive pulse signals Pd, Nd. In other words, the control circuit 22 in the power supply generating circuit 20 performs power supply control based on the voltage Vout of the first power supply line 32 in the second integrated circuit device IC2.

Figure 7A:
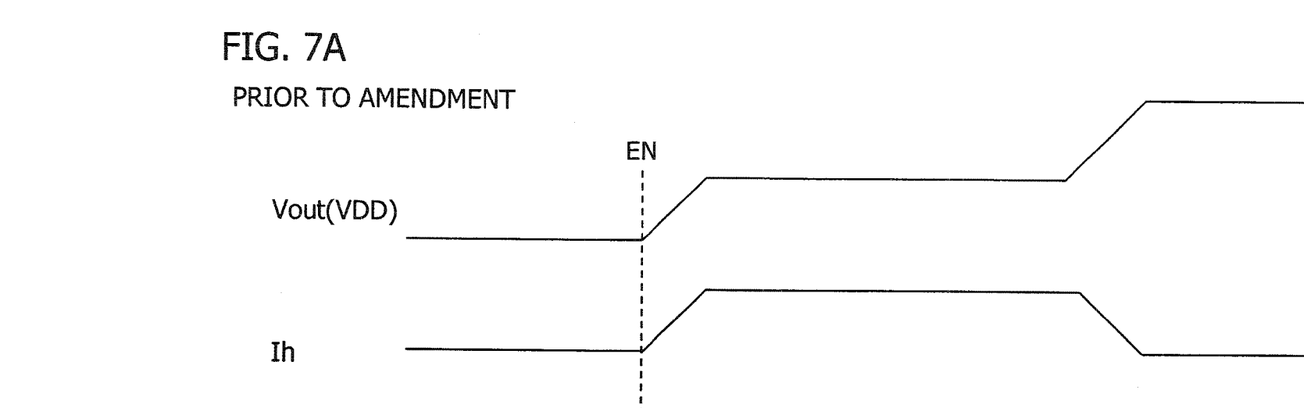
FIG. 7 is a view indicating operation waveforms according to the second embodiment.
Figure 7B:
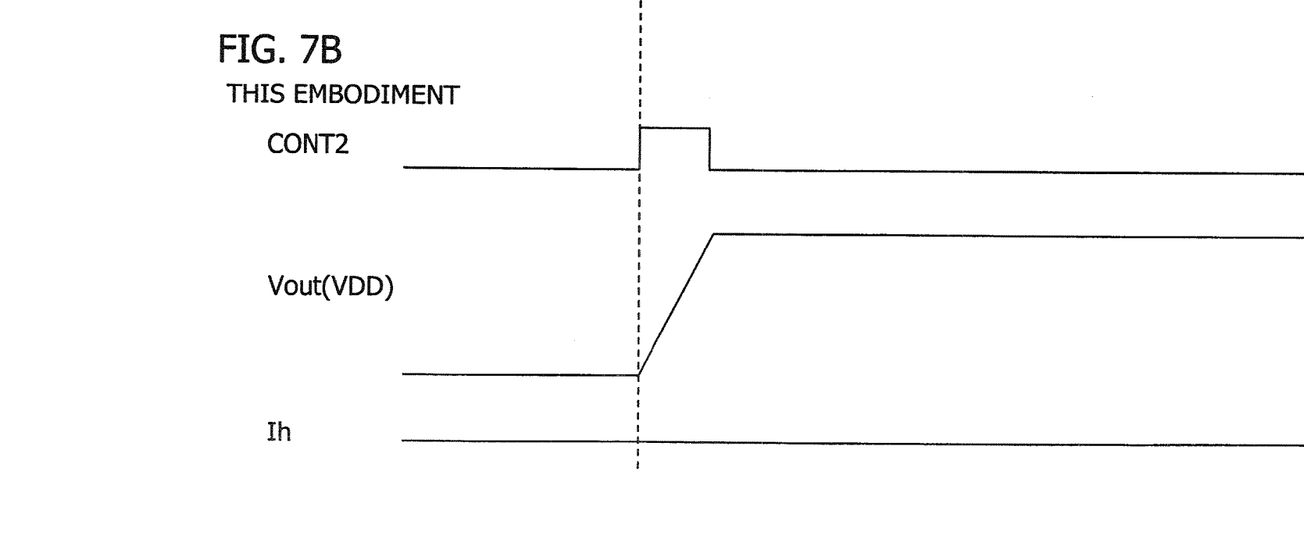

FIG. 7 is a view indicating operation waveforms according to the second embodiment. FIG. 7A shows problematic operation waveforms, and FIG. 7B shows improved operation waveforms according to the second embodiment. In response to an activation signal EN, the power supply generating circuit 20 starts to generate the output voltage Vout from the voltage Va of the power supply line 12. The output voltage Vout then increases with the switching operation performed on the transistors P10, N12 by the drive pulse signals Pd, Nd from the control circuit 22. The electrostatic protection circuit 10(2) of the second integrated circuit device IC2 takes this increase in the output voltage Vout as a surge voltage caused by static electricity, and therefore energizes the transistor N3 such that a current Ih (see FIG. 6) begins to flow. As a result, the output voltage Vout temporarily stops increasing, as shown in FIG. 7A. When the time constant period of the filter circuit in the electrostatic protection circuit 10(2) eventually elapses, the transistor N3 becomes non-conductive such that the current Ih is stopped, and accordingly, the output voltage Vout increases again to a desired voltage level.

Since the activation of the output voltage Vout by the power supply generating circuit 20 is temporarily halted by the current absorption function of the electrostatic protection circuit 10(2) in this manner, an activation waveform of the voltage Ve supplied to the internal load circuit 30 from the internal power supply line 32 becomes stepped. This type of activation waveform is undesirable since it causes delays in an activation operation and the like in a case where the power supply generating circuit 20 is frequently shifted to a sleep state in order to conserve energy, for example.

Figure 8:
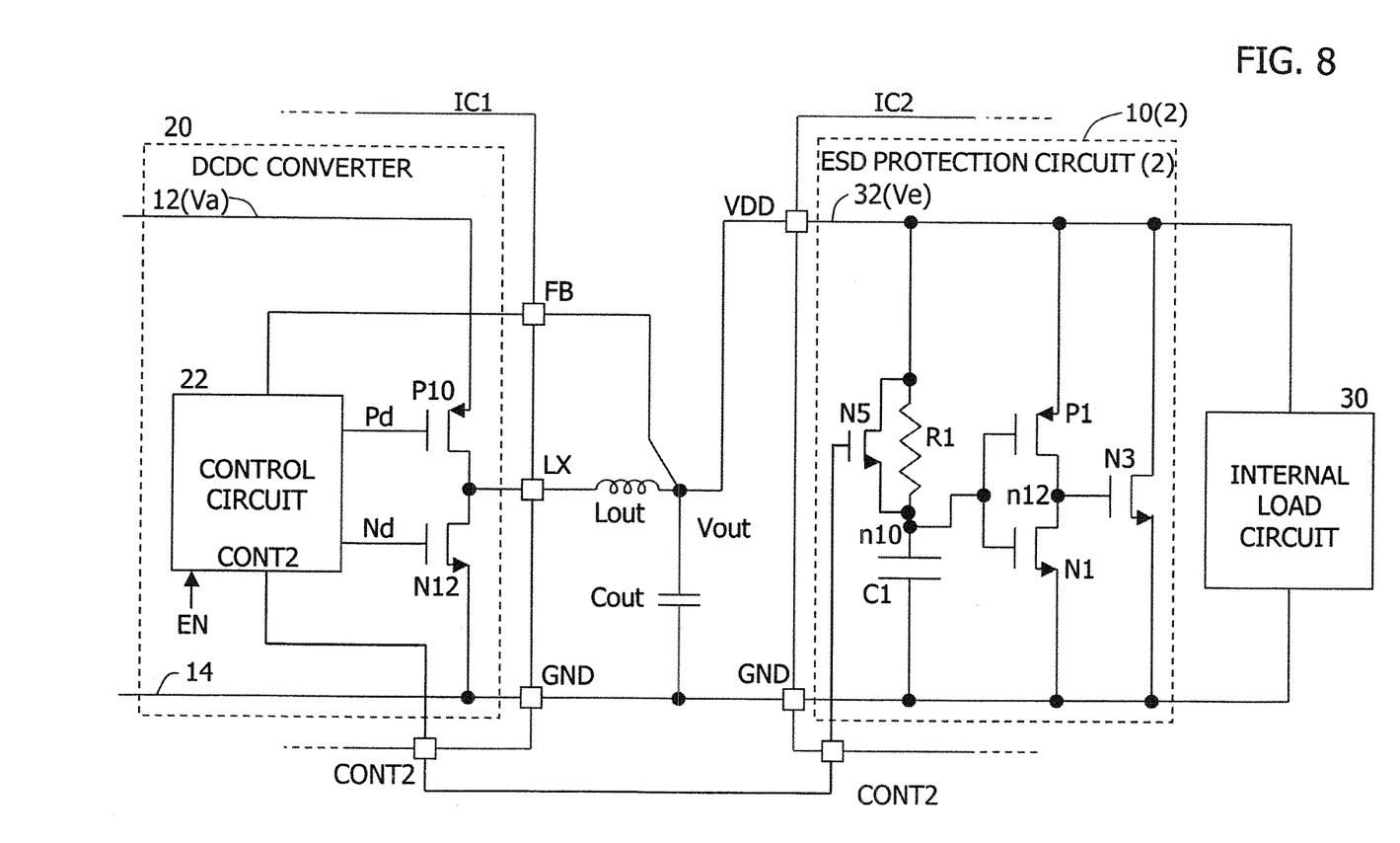
FIG. 8 is a constitutional diagram of the integrated circuit device according to the second embodiment.

FIG. 8 is a constitutional diagram of the integrated circuit device according to the second embodiment. The constitution shown in FIG. 8 differs from that of FIG. 6 in that the control circuit 22 of the power supply generating circuit 20 generates a second control signal CONT2 when activated, and a transistor N5 in the electrostatic protection circuit 10(2) is energized by the second control signal CONT2 such that the time constant period of the electrostatic protection circuit 10(2) is temporarily shortened. In other words, the transistor N5 corresponds to an adjustment circuit for temporarily shortening the time constant period of the filter circuit. All other constitutions are identical to those shown in FIG. 6.

As shown in FIG. 7B, the control circuit 22 sets the second control signal CONT2 at the H level when the activation signal EN is applied to the power supply generating circuit 20. In response thereto, the transistor N5 in the electrostatic protection circuit 10(2) is energized such that the time constant period of the filter circuit is temporarily shortened. In other words, the time constant of the filter circuit becomes a CR time constant of an ON resistance of the transistor N5 and the capacitor C1 in response to the second control signal CONT2. Accordingly, in the electrostatic protection circuit 10(2), the node n10 increases in response to an increase in the output voltage Vout, or in other words an increase in the voltage Ve of the first power supply line 32, which is supplied from the external power supply terminal VDD, and therefore the conduction of the transistor N3 is avoided. That is, the absorption current Ih is not generated. As a result, the output voltage Vout increases to the desired voltage level upon activation of the power supply generating circuit without stopping temporarily, and therefore the activation operation of the power supply generating circuit 20 is completed in a short amount of time.

Figure 9:
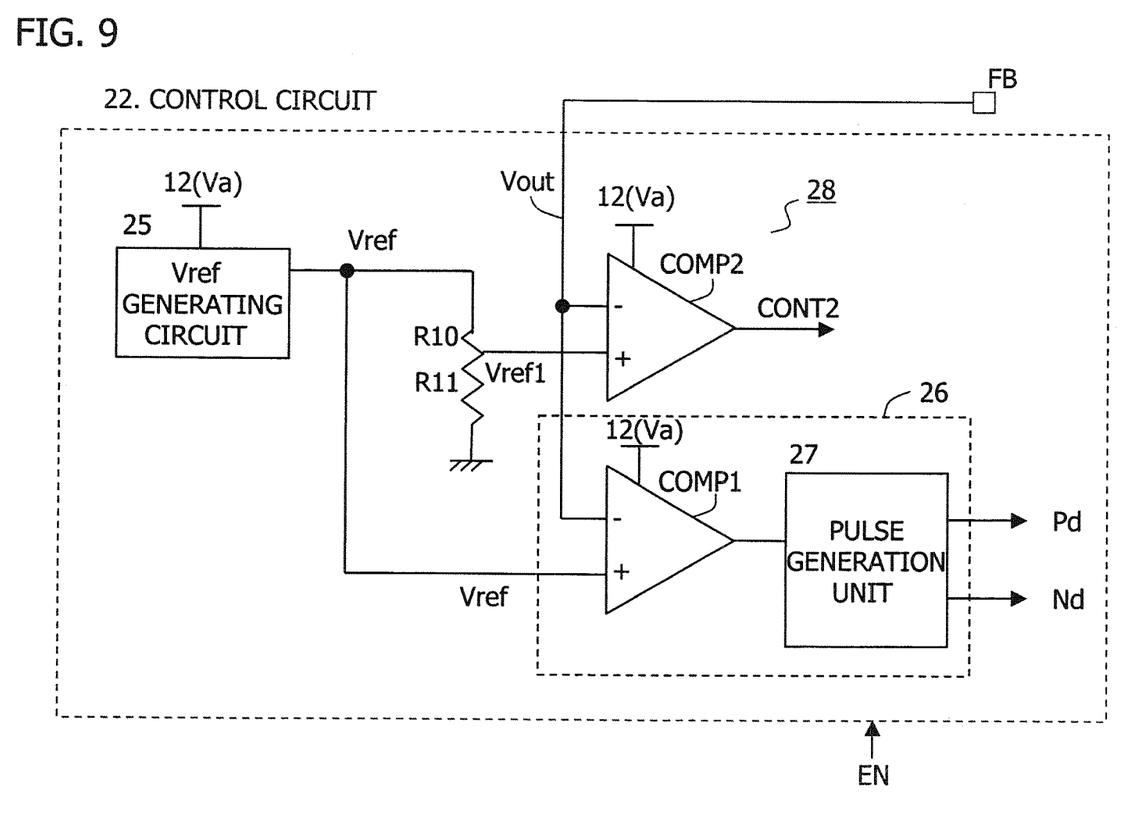
FIG. 9 is a constitutional diagram of the control circuit 22 provided in the power supply generating circuit 20 according to the second embodiment.

FIG. 9 is a constitutional diagram of the control circuit 22 provided in the power supply generating circuit 20 according to the second embodiment. The control circuit 22 includes a reference voltage generating circuit 25 for generating a reference voltage Vref from the supply power supply 12 (Va), and a modulation unit 26. The modulation unit 26 includes a first comparator COMP1 for comparing the reference voltage Vref to the output voltage Vout, and a pulse generation unit 27 for generating the drive pulse signals Pd, Nd based on an output of the comparator COMP1. Thus, the modulation unit 26 generates the drive pulse signals Pd, Nd based on the reference voltage Vref and the fed-back output voltage Vout. The reference voltage generating circuit 25 and the comparator COMP1 use the voltage of the power supply 12 (Va) as a power supply voltage.

The control circuit 22 also includes a control signal generation unit 28. The control signal generation unit 28 is constituted by a second comparator COMP2 for comparing a low reference voltage Vref1 obtained by dividing the reference voltage Vref by resistances R10, R11 to the output voltage Vout, whereby the second comparator COMP2 generates the second control signal CONT2.

Figure 10:
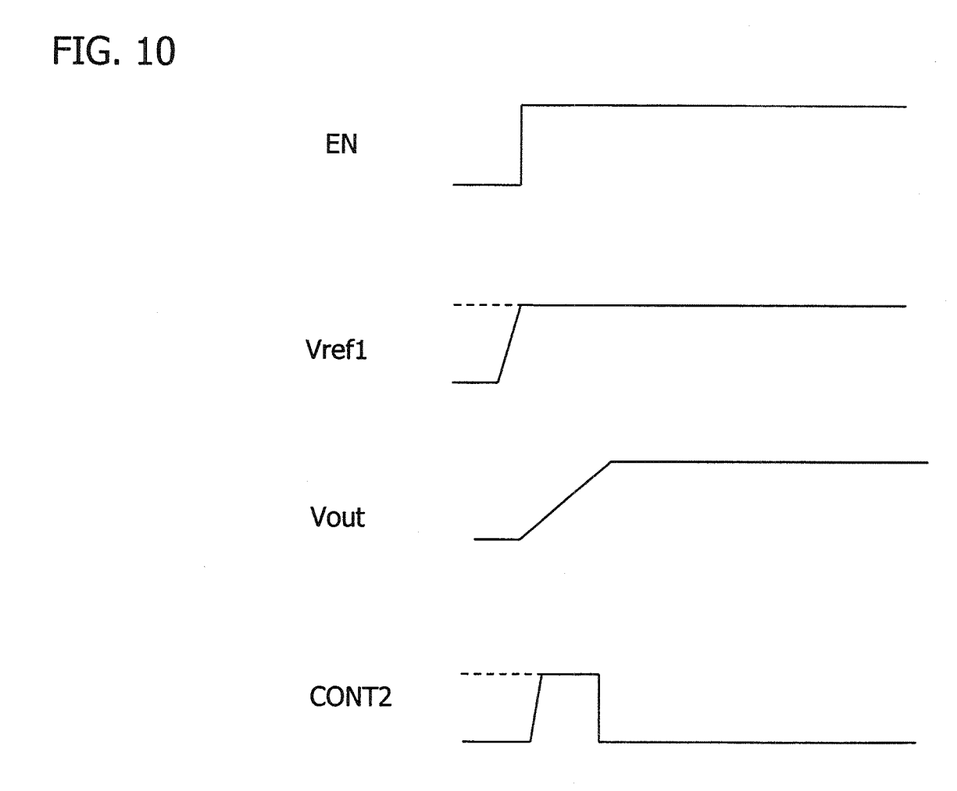
FIG. 10 is a waveform diagram indicating an operation of the control signal generation unit 28 for generating the second control signal CONT2.

FIG. 10 is a waveform diagram indicating an operation of the control signal generation unit 28 for generating the second control signal CONT2. When the activation signal EN rises, the reference voltages Vref and Vref1 rise quickly or have already risen (a broken line in the drawing). Meanwhile, in response to the activation signal EN, the control circuit 22 starts to generate the drive pulse signals Pd, Nd such that the output voltage Vout rises. The second comparator COMP2 compares the reference voltage Vref1 to the output voltage Vout, which rises later than the reference voltage Vref1, sets the second control signal CONT2 at the H level, and maintains the second control signal CONT2 at the H level until the output voltage Vout rises.

Hence, the transistor N5 shown in FIG. 8 remains conductive until the rise of the output voltage Vout is complete, and therefore the period of the CR time constant of the electrostatic protection circuit 10(2) is shortened. As a result, the current absorption operation performed by the transistor N3 of the electrostatic protection circuit is suppressed.

Hence, the second comparator COMP2 generates the second control signal CONT2 using the reference voltage Vref generated in the control circuit 22 in the manner described above.

Third Embodiment

Figure 11:
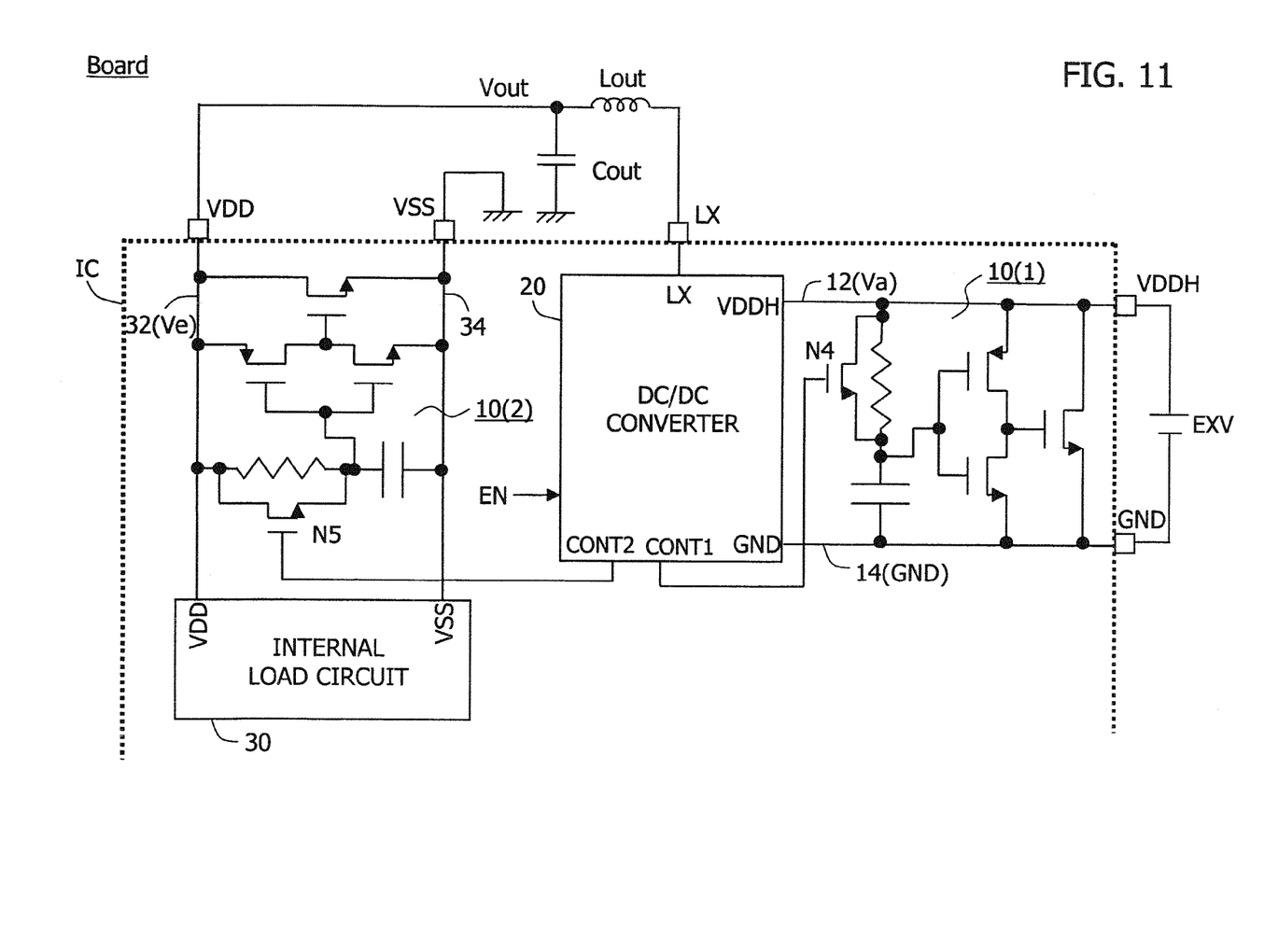
FIG. 11 is a constitutional diagram of an integrated circuit device according to a third embodiment.

FIG. 11 is a constitutional diagram of an integrated circuit device according to a third embodiment. This integrated circuit device IC includes the power supply generating circuit 20 for generating the voltage Vout from a power supply voltage VDDH to which an external power supply voltage EXV is supplied, the first power supply line 12 to which the power supply voltage VDDH is supplied, and the second power supply line 14 coupled to the ground terminal GND. An electrostatic protection circuit 10(1) is provided on the external terminals VDDH and GND.

Meanwhile, the output voltage Vout is generated in a connection node of the external output inductor Lout and output capacitor Cout coupled to the node LX of the power supply generating circuit 20. The generated output voltage Vout is then supplied back to the integrated circuit device IC as the internal power supply VDD of the internal load circuit 30. An electrostatic protection circuit 10(2) is also provided in external terminals VDD and VSS.

As described in the first embodiment, a through current that flows through the CMOS inverter of the electrostatic protection circuit 10(1) due to minute noise generated in the first power supply line 12 by the switching operation performed in the power supply generating circuit 20 to generate the output voltage Vout is prevented from occurring by the first control signal CONT1 and the transistor N4 being controlled to be conductive by the first control signal CONT1. As a result, wasteful power consumption may be prevented.

Further, as described in the second embodiment, a temporary stoppage in the rise of the voltage Ve of the internal power supply line 32 occurring when the electrostatic protection circuit 10(2) operates in response to the rise of the output voltage Vout during activation of the power supply generating circuit 20 is prevented by the second control signal CONT2 and the transistor N5 being controlled to be conductive by the second control signal CONT2. As a result, a rising waveform of the output voltage generated by the power supply generating circuit 20 rises smoothly, thereby preventing an increase in the time to complete activation and inappropriateness in the rising waveform of the internal power supply VDD.

As described in the above embodiments, by providing the electrostatic protection circuit with the adjustment circuit N4, N5 for shortening the CR time constant period in response to the control signal CONT1, CONT2, a malfunction occurring in the electrostatic protection circuit during an operation of the power supply generating circuit that performs power supply control based on the voltage of the first power supply line is prevented, thereby preventing an increase in power consumption and inappropriateness in the activation operation.

Aforementioned embodiments may provide an integrated circuit device that suppresses a malfunction of an electrostatic protection circuit caused by an operation of a power supply generating circuit.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention, have been described in detail, it should be understood that the various changes, substitutions, and alterations could be made hereto without departing from the spirit and scope of the invention.

What is claimed is:

1. An integrated circuit device comprising:
   an electrostatic protection circuit having a filter coupled between first and second power supply lines, the first and second power supply lines being coupled to respective external terminals, a switch circuit coupled between the first power supply line and an output of the filter, and a current pathway between the first and second power supply lines being formed in response to an increase in a voltage between the first and second power supply lines; and
   a power supply generating circuit having a switching element with a first terminal to which a voltage of the first power supply line is provided, and being configured to generate a switching control signal for controlling the switching element ON and OFF and to control a power supply voltage according to a voltage of a second terminal of the switching element, based on the switching control signal,
   wherein the power supply generating circuit generates, based on the switching control signal, an electrostatic protection circuit control signal for controlling the electrostatic protection circuit, and
   in the electrostatic protection circuit, the switching circuit turns ON in response to the electrostatic protection circuit control signal.

2. The integrated circuit device according to claim 1, wherein
   the power supply generating circuit generates the power supply voltage from the voltage of the first power supply line according to a switching operation of the switching element,
   the filter generates, in response to an increase in the voltage between the first and second power supply lines, an output signal following the increase in the voltage, and
   the electrostatic protection circuit has:
   a CMOS inverter that inputs the output signal from the filter; and
   a current pathway switch that is controlled by an output of the CMOS inverter so as to form the current pathway in response to the increase in the voltage between the first and second power supply lines.

3. The integrated circuit device according to claim 2, wherein the electrostatic protection circuit control signal includes a pulse signal generated at the switching timing of the switching element, and the switching circuit turns ON based on the pulse signal included in the electrostatic protection circuit control signal.

4. The integrated circuit device according to claim 2, wherein
   the power supply generating circuit generates the electrostatic protection circuit control signal at a switching timing of the switching control signal, at which the switching element is switched from ON to OFF.

5. The integrated circuit device according to claim 1, wherein the electrostatic protection circuit control signal includes a pulse signal generated at the switching timing of the switching element, and the switching circuit turns ON based on the pulse signal included in the electrostatic protection circuit control signal.

6. The integrated circuit device according to claim 1, wherein
   the power supply generating circuit generates the electrostatic protection circuit control signal at a switching timing of the switching control signal, at which the switching element is switched from ON to OFF.

7. An integrated circuit device comprising:
   an electrostatic protection circuit having a filter coupled between first and second power supply lines, a switch circuit coupled between the first power supply line and an output of the filter, and a current pathway between the first and second power supply lines being formed in response to an increase in a voltage between the first and second power supply lines; and
   a power supply generating circuit having a switching element with a first terminal to which a voltage of the first power supply line is provided, and being configured to generate a switch control signal for controlling the switching element ON and OFF and to control a power supply voltage according to a voltage of a second terminal or the switching element, based on the switching control signal,
   wherein the power supply circuit provides the power supply voltage to the first power supply line, and generates an electrostatic protection circuit control signal for controlling the electrostatic protection circuit, and
   in the electrostatic protection circuit, the switching circuit turns ON in response to the electrostatic protection circuit control signal.

8. The integrated circuit device according to claim 7, wherein the electrostatic protection circuit control signal includes a pulse signal generated at the switching timing of the switching element, and the switching circuit turns ON based on the pulse signal included in the electrostatic protection circuit control signal.

9. The integrated circuit device according to claim 7, wherein the power supply generating circuit starts the switching operation of the switching element in response to a power supply activation signal, and generates the electrostatic protection circuit control signal at a rise timing of the voltage of the first power supply line in response to the power supply activation signal.

10. The integrated circuit device according to claim 7, wherein the filter generates, in response to an increase in the voltage between the first and second power supply lines, an output signal following the increase in the voltage, and the electrostatic protection circuit has:

a CMOS inverter that inputs the output signal from the filter; and a current pathway switch that is controlled by an output of the CMOS inverter so as to form the current pathway in response to the increase in the voltage between the first and second power supply lines.

11. An integrated circuit device comprising:

an electrostatic protection circuit having a filter coupled between first and second power supply lines, the first and second power supply lines being coupled to respective external terminals, a switch circuit coupled between the first power supply line and an output of the filter, and a current pathway between the first and second power supply lines being formed in response to an increase in a voltage between the first and second power supply lines; and a power supply generating circuit having a switching element with a first terminal to which a voltage of the first power supply line is provided, and being configured to generate a switching control signal for controlling the switching element ON and OFF and to control a power supply voltage according to a voltage of a second terminal of the switching element based on the switching control signal, wherein the power supply generating circuit generates an electrostatic protection circuit control signal at a switching timing at which the switching element is switched from ON to OFF, and in the electrostatic protection circuit, the switching circuit turns ON in response to the electrostatic protection circuit control signal.

12. The integrated circuit device according to claim 11, wherein the filter generates, in response to an increase in the voltage between the first and second power supply lines, an output signal following the increase in the voltage, and the electrostatic protection circuit has:

a CMOS inverter that inputs the output signal from the filter; and a current pathway switch that is controlled by an output of the CMOS inverter so as to form the current pathway in response to the increase in the voltage between the first and second power supply lines.

* * * * *